US 6,642,762 B2

(12) United States Patent
von Kaenel

(10) Patent No.: US 6,642,762 B2
(45) Date of Patent: Nov. 4, 2003

(54) METHOD AND APPARATUS TO ENSURE DLL LOCKING AT MINIMUM DELAY

(75) Inventor: Vincent R. von Kaenel, Palo Alto, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 10/294,372

(22) Filed: Nov. 14, 2002

(65) Prior Publication Data

US 2003/0067335 A1 Apr. 10, 2003

Related U.S. Application Data

(63) Continuation of application No. 09/901,794, filed on Jul. 9, 2001, now Pat. No. 6,504,408.

(51) Int. Cl.[7] .............................. H03K 5/13; H03D 3/24
(52) U.S. Cl. ....................................... 327/158; 327/160
(58) Field of Search ................................. 327/160, 156, 327/158, 376, 373, 374; 375/375; 331/25

(56) References Cited

U.S. PATENT DOCUMENTS 6,441,662 B2 * 8/2002 Ikeda .......................... 327/160

* cited by examiner

*Primary Examiner*—Dinh T. Le
(74) *Attorney, Agent, or Firm*—Lawrence J. Merkel; Meyertons, Hood, Kivlin, Kowert & Goetzel, P.C.; Erik A. Heter

(57) ABSTRACT

A method and apparatus to ensure DLL locking at a minimum delay is provided. In one embodiment, a DLL circuit includes a phase detector, a counter, a programmable delay line, and a counter control circuit. Upon initialization of the DLL circuit, the counter control circuit is configured to cause the counter to count increment, regardless of the phase relationship between a reference clock signal and the output clock signal. The counter continues incrementing, thereby changing the phase relationship between the reference clock signal and the output clock signal by adjusting the delay of the programmable delay line. This eventually results in a phase lock between the reference clock signal and the output clock signal at a minimum delay. Once the DLL achieves a phase lock between the reference clock signal and the output clock signal, the counter increments or decrements its count in order to maintain or re-acquire a lock.

20 Claims, 5 Drawing Sheets

METHOD AND APPARATUS TO ENSURE DLL LOCKING AT MINIMUM DELAY

This application is a continuation of U.S. patent application Ser. No. 09/901,794 filed on Jul. 9, 2001, now U.S. Pat. No. 6,504,408.

BACKGROUND OF THE INVENTION

1. Field of the Invention

This invention relates to timing circuits, and more particularly, to delay locked loop (DLL) circuits.

2. Description of the Related Art

Delay locked loops (DLLs) are commonly used in computer systems and other electronic systems in order to ensure proper timing. A typical delay locked loop includes a phase detector, a counter, and a programmable delay line. The phase detector may be used to compare the phase between two input clock signals, wherein one of the clock signals may be a reference clock signal and the other may be a clock signal fed back from the DLL output. The phase detector may generate an UP or DOWN signals based on the phase relationship between the input clock signals, which may then be driven to a counter. The counter may then count up or down, thereby adjusting the delay of the programmable delay line until the two input clock signals are in phase.

Since a typical phase detector may compare only the phase difference between two input clock signals, it is possible for a DLL to have multiple lock points. Thus, it is no possible for the DLL to lock at a point that is N times the input period of a reference clock signal, wherein N is an integer value greater than or equal to one. When the goal is to generate certain type of signals (such as quadrature signals, i.e. signals with a 90° phase difference), locking at a value of N greater than one may be unsuitable. In such cases, the designer of the DLL circuit must ensure that the DLL locks at a value of N=1.

SUMMARY OF THE INVENTION

A method and apparatus to ensure DLL locking at a minimum delay is provided. In one embodiment, a DLL circuit includes a phase detector, a counter, a programmable delay line, and a counter control circuit. Upon initialization of the DLL circuit, the counter control circuit may be configured to cause the counter to increment, regardless of the phase relationship between a reference clock signal and the output clock signal of the DLL circuit. More particularly, the counter control circuit may cause the counter to increment, even if the phase detector outputs initially indicate that the counter is to decrement. The counter may continue incrementing, thereby changing the phase relationship between the reference clock signal and the output clock signal by adjusting the delay of the programmable delay line, until the phase detector indicates increment, then subsequently indicates decrement. This may eventually result in a phase lock between the reference clock signal and the output clock signal at a minimum delay at which a phase lock may be achieved among possible delays at which a lock might be achievable. Then, the counter control circuit may cause the counter in increment or decrement from the indications provided by the phase detector. Once the DLL achieves a phase lock between the reference clock signal and the output clock signal, the counter may then increment or decrement its count as necessary in order to maintain or re-acquire a lock.

In one embodiment, the DLL circuit includes a phase detector, a counter control circuit, a counter, and a programmable delay line. The phase detector may receive a reference clock signal, as well as an output clock signal from the programmable delay line. The phase detector may determine the phase relationship between the reference clock signal and the output clock signal. In response to determining the phase relationship, the phase detector may generate signals indicating whether the counter is to be incremented or decremented, as well as indicating whether the DLL circuit has obtained a lock. The phase detector may drive these signals to a counter control circuit. In response, the counter control circuit may be configured to generate signals which cause the counter to increment or decrement. The counter control circuit may be configured to cause the counter to increment upon initialization of the DLL circuit, wherein initialization includes setting the value of the counter output to zero. A re-initialization of the DLL circuit may occur responsive the counter control circuit receiving a reset signal.

The counter may increment or decrement depending upon the signals received from the counter control circuit. The output of the counter may be driven to the programmable delay line, where the value of the count may adjust the delay of the reference clock signal and thereby produce an output clock signal. The output clock signal may be fed back to the phase detector for a phase comparison with the reference clock signal.

By forcing the counter to increment upon initialization or reset of the DLL circuit, the DLL circuit may be able to obtain a phase lock at a minimum delay of the programmable delay line. The delay at which a phase lock occurs may be at the delay at which the output clock and reference clock frequencies match. In one embodiment, the DLL circuit is configured to obtain a phase lock at N=1, wherein N is an integer multiple of the clock period.

BRIEF DESCRIPTION OF THE DRAWINGS

Other aspects of the invention will become apparent upon reading the following detailed description and upon reference to the accompanying drawings in which.

Figure 1:
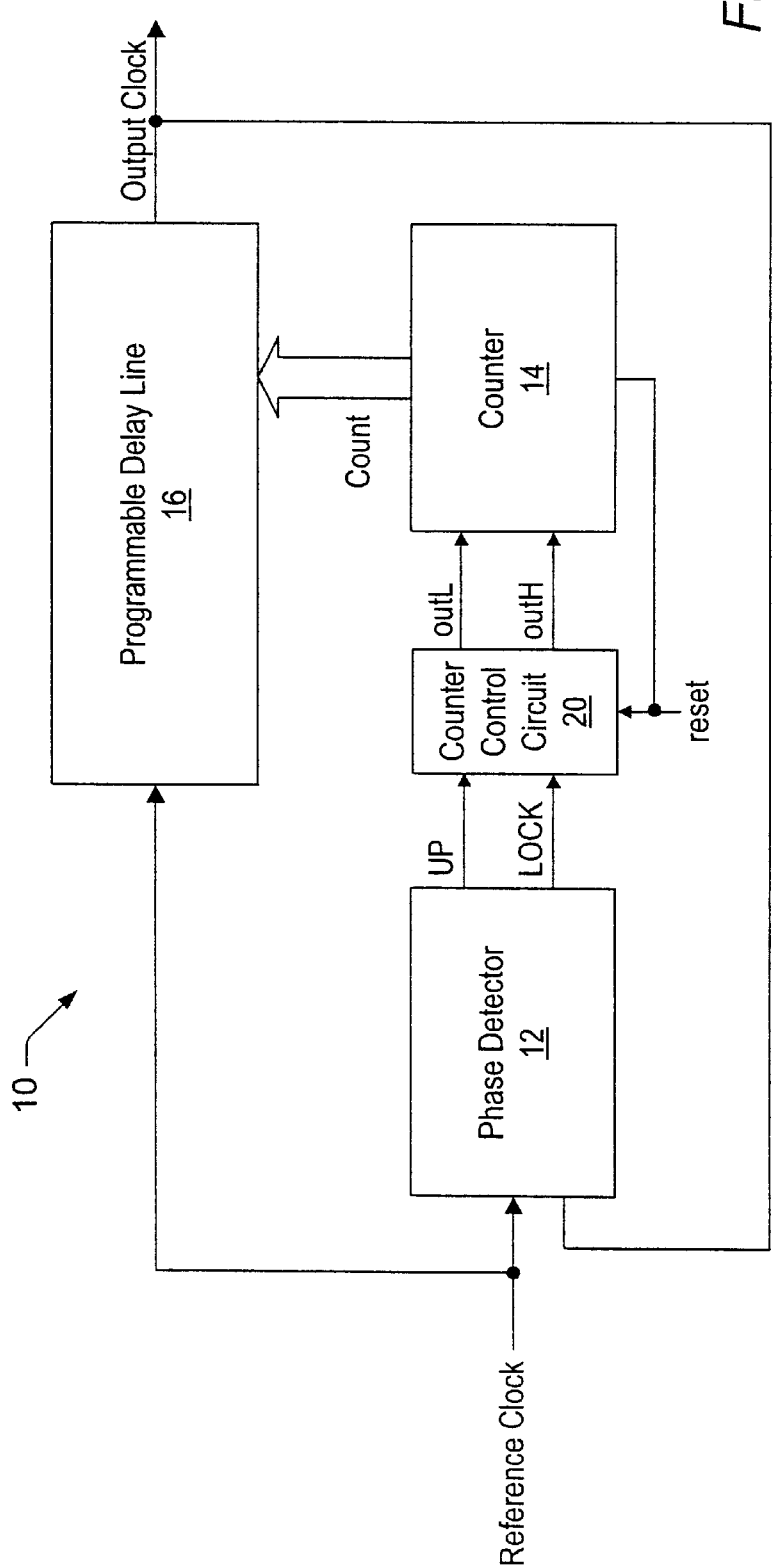
FIG. 1 is a block diagram of one embodiment of a DLL circuit.

While the invention is susceptible to various modifications and alternative forms, specific embodiments thereof are shown by way of example in the drawings and will herein be described in detail. It should be understood, however, that the drawings and description thereto are not intended to limit the invention to the particular form disclosed, but, on the contrary, the invention is to cover all modifications, equivalents, and alternatives falling with the spirit and scope of the present invention as defined by the appended claims.

DETAILED DESCRIPTION OF THE PREFERRED EMBODIMENTS

Turning now to FIG. 1, a block diagram of one embodiment of a DLL circuit is shown. DLL circuit 10 includes phase detector 12, counter 14, programmable delay line 16, and counter control circuit 20. DLL circuit 10 is configured to receive a reference clock signal (Reference clock in FIG. 1) and produce an output clock signal (Output clock in FIG. 1). The reference clock signal in this embodiment is received by both phase detector 12 and programmable delay line 16. Phase detector 12 is also configured to receive an output clock signal from programmable delay line 16 via a feedback loop. Phase detector 12 is configured to determine the phase relationship between the reference no clock signal and the output clock signal. Phase detector 12 may also generate signals responsive to determining the phase difference between the reference clock signal and the output clock signal. In the embodiment shown, phase detector 12 is configured to generate an UP signal and a LOCK signal. The UP signal, when active, indicates that counter 14 is to count up (increment) based on the phase difference between the reference clock signal and the output clock signal. An indication that counter 14 is to count down (decrement) based on the phase difference may be provided when the UP signal is in an inactive state and the LOCK signal is in an inactive state. An active state of the LOCK signal indicates that DLL circuit 10 has obtained a phase lock between the reference clock signal and the output clock signal.

Counter control circuit 20 is arranged between phase detector 12 and counter 14, and is configured to receive the UP and LOCK signals. Counter control circuit 20 may respond to the UP and LOCK signals by generating control signals outL or outH. An active state of the outL signal may indicate to counter 16 that it is to decrement its count, while an active state of the outH signal may indicate to counter 16 that it is to increment its count. In one embodiment, incrementing the counter selects a longer delay in the programmable delay line 16, while decrementing the counter selects a shorter delay. Thus, if the output clock leads the reference clock, counter control circuit 20 may cause counter 14 to increment. If the output clock lags the reference clock, counter control circuit 20 may cause the counter to decrement.

Counter control circuit 20 may also be configured, in response to initialization or reset of DLL circuit 10, to cause counter 14 to increment even if phase detector 12 indicates that counter 14 should decrement. Counter control circuit 20 may continue forcing the incrementing of counter 14 until phase detector 12 transitions from indicating increment (UP) to indicating decrement for the first time. Thereafter, counter control circuit 20 may generate the outL and outH signals which reflect the outputs of phase detector 12. More particularly, the outL and outH signals may reflect the outputs of phase detector 12 as follows: the OutH signal may be active in response to the UP signal being active, and otherwise may be inactive; and the OutL signal may be active in response to the UP signal being inactive and the LOCK signal being inactive, and otherwise may be inactive.

Counter 14 may generally increment or decrement in response to the outH and outL signals. More particularly, the counter 14 may increment in response to an active outH signal, decrement in response to an active outL signal, and hold steady if neither the outH nor outL signals is active.

Counter 14 may be one of many different types of synchronous binary counters. The exact number of outputs of counter 14 may depend upon the requirements of programmable delay line 16. Counter 14 may also receive one or more signal inputs that cause it to increment or decrement (e.g. outL and outH). The output signals produced by counter 14 may be driven to programmable delay line 16 in order to control the amount of delay experienced by the reference clock signal. Counter 14 may be a rollover counter or a saturating counter, as desired.

Both counter 14 and counter control circuit 20 are configured to receive a reset signal. The reset signal may be activated to initialize or reset DLL circuit 10. IN response to activation of the reset signal, counter 14 may reset its count to zero, while counter control circuit may activate the outH signal, thereby forcing counter 14 to begin incrementing, until the phase detector 12 transitions from indicating increment to indicating decrement. The phase detector 12 may indicate decrement initially, but then eventually indicate increment as the phase difference between the reference clock and the output clock chances in response to the forced increments. Subsequently, the phase detector may indicate decrement again in response to phase changes. Similarly, if the phase detector 12 indicates increment initially, it may eventually indicate decrement as the phase difference changes in response to the forced increments.

Programmable delay line 16 may be configured to provide a delay to the reference clock signal, and thereby produce an output clock signal. The output clock signal may be fed back to phase detector 12, which may then determine the phase relationship between the reference clock signal and the output clock signal. Programmable delay line 16 may be configured to adjust the phase relationship between the clock signals. The amount of delay provided, as well as the direction of adjustment, may be controlled by the inputs received from counter 14. In one embodiment, the amount of delay provided by programmable delay line 16 increases as counter 14 increments, while decreasing as counter 14 decrements.

Alternate embodiments of DLL circuit 10 are possible and contemplated. For example, the output signals generated by phase detector 12 may include UP and DOWN signals in an alternate embodiment, wherein an active UP signal indicates incrementing, an active DOWN signal indicates decrementing, and a phase lock is indicated when both signals are inactive. In another alternative embodiment, DOWN and LOCK signals may be generated by phase detector 19, wherein an active DOWN signal with an inactive LOCK signal indicates decrementing, and an inactive DOWN signal along with an inactive LOCK signal indicates incrementing. An active LOCK signal indicates LOCK. Furthermore, for the embodiments illustrated in FIGS. 2 and 3, signals may be active high (binary 1) and inactive low (binary 0). Other embodiments may define one or more of the signals as active low and inactive high, with the logic circuit changed accordingly.

It is noted that, while one embodiment of the counter control circuit 20 causes the counter 14 to increment at reset, other embodiments may cause the counter to decrement at reset, as desired. For example, if incrementing the counter decreases the delay of the delay line 16 and decremented increases the delay, then decrementing, at reset may be desirable (and the counter 14 may be initialized to all binary ones, for example).

Figure 2:
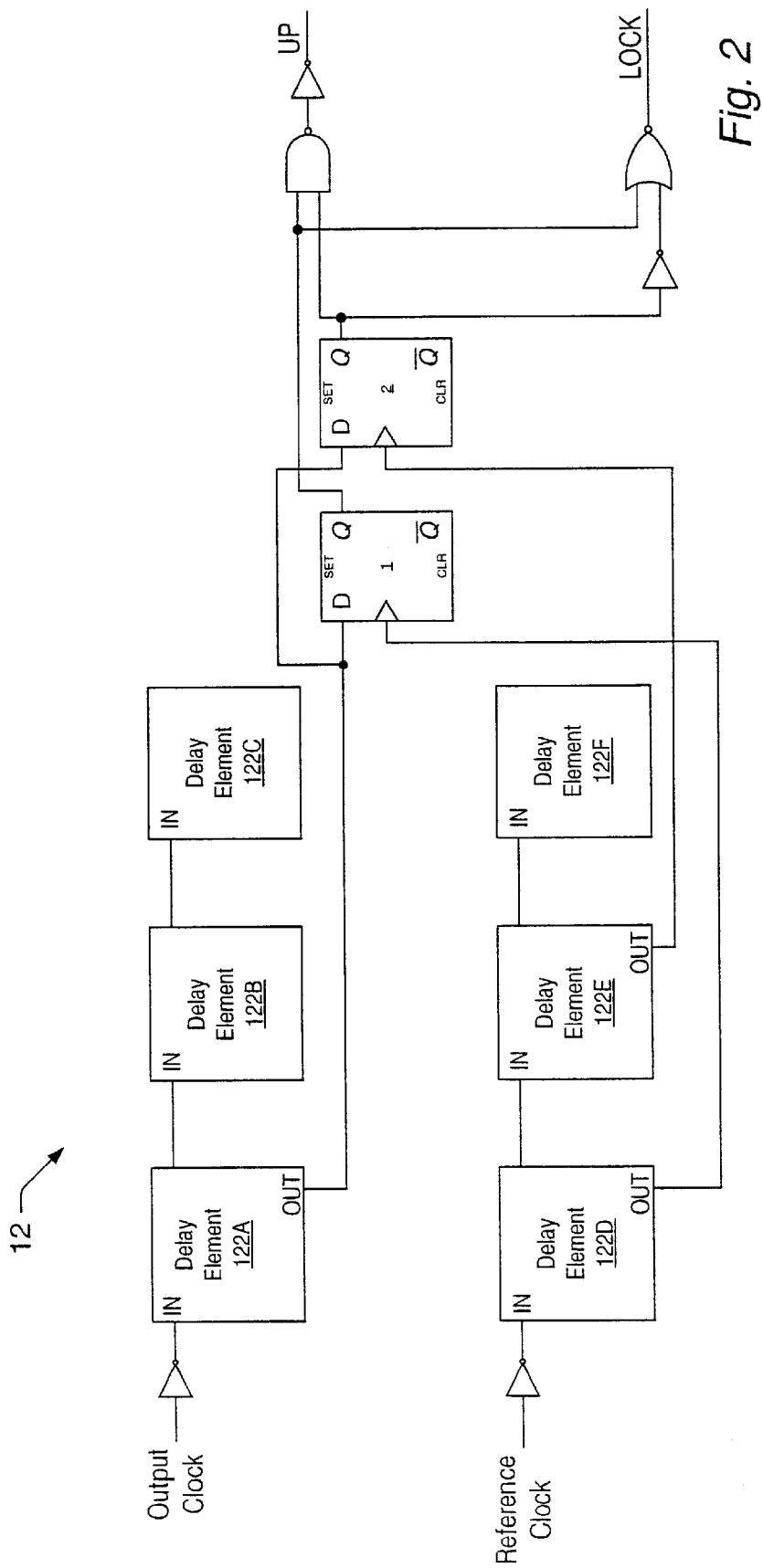
FIG. 2 is schematic diagram of one embodiment of a phase detector.

Moving now to FIG. 2, a schematic diagram of one embodiment of phase detector 12 is shown. Phase detector 12 includes a plurality of delay elements 122, a pair of flip-flops, and logic gates to drive output signals. Other embodiments are possible and contemplated. The delay elements may be programmable delay elements. In one embodiment, delay elements 122 are programmable delay elements, but are hardwired to a predetermined value.

Delay elements 122 of the embodiment of phase detector 12 shown in FIG. 2 are arranged in two chains, the first of which comprises delay elements 122A, 122B, and 122C. The second chain of delay elements comprises delay elements 122D, 122E, and 122F. The first chain of delay elements is configured to receive the output clock signal from a programmable delay line, such as programmable delay line 16 of FIG. 1. The second chain of delay elements is configured to receive the reference clock signal. The output clock signal, received by delay element 122A, passes through the delay element to the D-input of both flip-flops 1 and 2, and to delay element 122B. The output clock signal also passes from delay element 122B to delay element 122C. Similarly, the reference clock signal passes through delay element 122D and delay element 122E to the clock input of flip-flop 1 and the clock input of flip-flop 2, respectively. In addition, the reference clock signal passes through delay element 122E to delay element 122F. The presence of delay elements 122B and 122C in the first chain, as well as the presence of delay element 122F in the second chain is primarily to balance the impedance experienced by the output clock signal and the reference clock signal, providing approximately equal delay on each signal at the output of each corresponding delay element.

As previously noted, the output clock signal passes through delay element 122A to the input of both flip-flops 1 and 2, which are D flip-flops in this embodiment. Embodiments of phase detector 12 utilizing other types of flip-flops are possible and contemplated. Flip-flops 1 and 2 are clocked by the reference clock outputs of delay elements 122D and 122E, respectively. Because the reference clock signal passing through delay element 122E encounters additional delay, flip-flop 1 may receive a rising edge at its clock input before flip-flop 2. The output clock signal passing through delay element 122A and the reference clock signal passing through delay element 122D may encounter substantially the same amount of delay, while the signal from the output of delay element 122E may be approximately twice that of the signal output from delay element 122D. Accordingly, flip-flop 1 may capture the value of the output clock signal earlier in time than flip-flop 2.

In the embodiment shown, output logic gates may be used to provide an indication as to whether counter 14 is to increment or decrement, as well as providing an indication as to whether the DLL circuit 10 has obtained a lock. The UP signal may be active when the outputs (Q) of flip-flops 1 and 2 are simultaneously high. This is due to the fact that at the rising edge of the reference clock, flip-flop 1 captures a high (i.e. the captured state of the output clock), and at the rising edge of a delayed reference clock (from the output of delay element E), flip-flop 2 captures a high. This is an indication that the rising edge of the output clock signal is occurring before the rising edge of the reference clock signal. Thus, by increasing the delay (by incrementing counter 14), subsequent edges of the output clock signal may be closer to subsequent edges of the reference clock signal.

The LOCK signal may become active when flip-flop 1 captures a low on the rising edge of the reference clock signal and flip-flop 2 captures a high on the rising edge of the delayed reference clock signal. This is an indication that the rising edge of the reference clock signal is within one delay time (as provided by the delay elements) of the rising edge of the output clock signal.

In other cases, both the LOCK and UP signals may be inactive, indicating that the rising edge of the reference clock may be occurring before the rising edge of the output clock. When both the LOCK and UP signals are inactive, the rising edge of the reference clock signal and the rising edge of the output clock signal may be brought closer together by decreasing the delay, which is accomplished by decrementing counter 14.

As mentioned above, alternative embodiments of DLL circuit 10 may include a phase detector 12 which generates UP and DOWN signals, or DOWN and LOCK signals. Logic circuitry may be designed to generate an UP signal whenever the outputs of flip-flops 1 and 2 are simultaneously high. Logic circuitry may be designed to generate a DOWN signal whenever the output of flip-flop 2 is low. Logic circuitry to generate a LOCK signal may be designed such that the LOCK signal becomes active whenever the output of flip-flop 1 is low at the same time the output of flip-flop 2 is high. The logic circuitry for any of these embodiments may be designed such that the signals generated are active high or active low.

It is noted that, in one embodiment, the delay elements 122A–122F include an odd number of inverters between the input (IN) and the output (OUT). Thus, the input inverters between the output clock signal and delay element 122A and the reference clock and delay element 122B are provided. In other embodiments, an even number of inverters may be included in the delay elements and the input inverters may be deleted.

Figure 3:
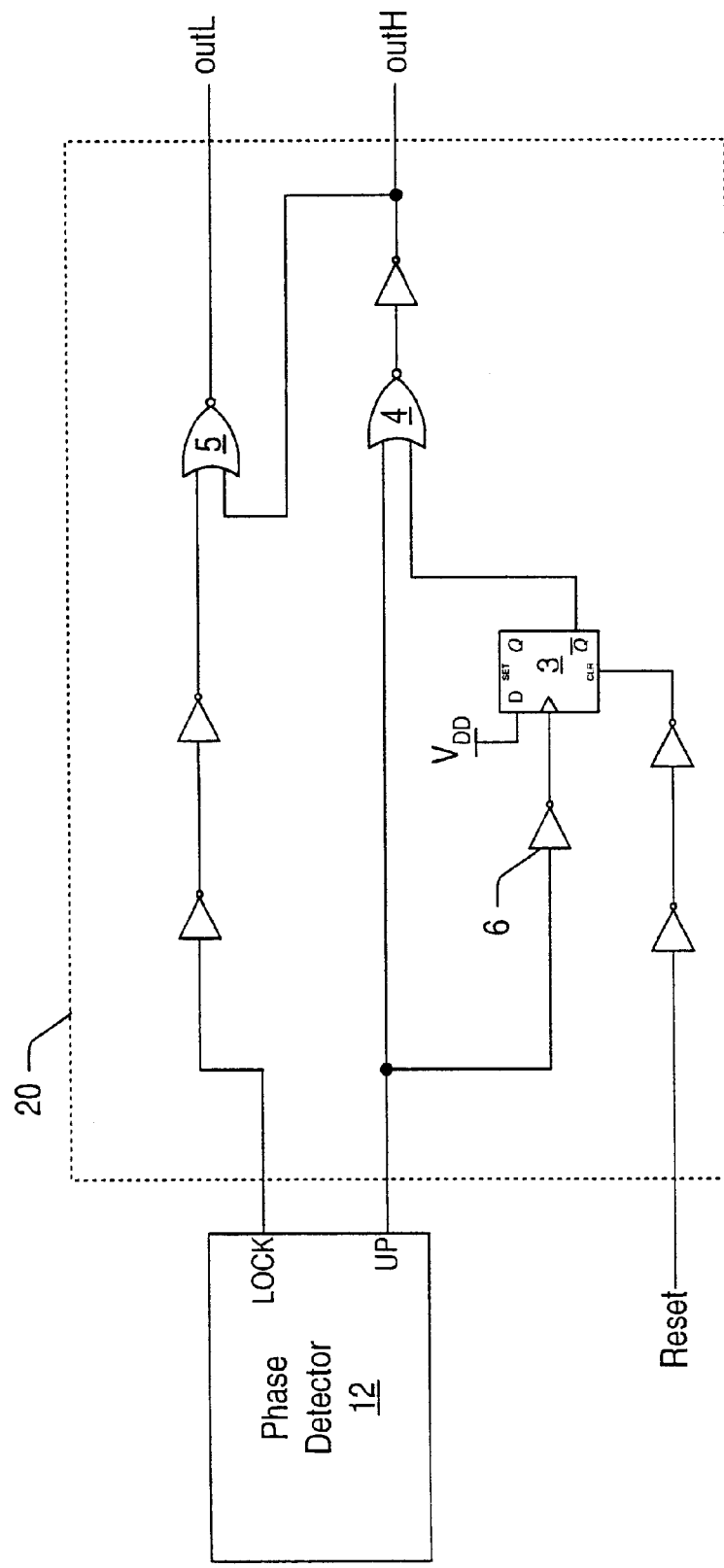
FIG. 3 is a schematic diagram of one embodiment of a counter control circuit.

Turning now to FIG. 3, a schematic diagram of one embodiment of a counter control circuit is shown. Counter control circuit 20 is configured to receive the UP and LOCK signals from phase detector 12. Responsive to the combinations of signals received, counter control circuit 20 may produce an outL signal or an outH signal. The outL signal, when active, may cause counter 14 to decrement, while the outH signal, when active, may cause counter 14 to increment.

The outL signal may be active in response to both the LOCK and UP signals from phase detector 12 being inactive and if counter control circuit 20 is not forcing the outH signal active after a reset. The LOCK signal being inactive is included in the embodiment of FIG. 3 as the upper input of the NOR gate 5, and the remaining conditions are included through the lower input of the NOR gate 5 (which receives the outH signal). The outH signal may be active in response to the UP signal from phase detector being active (upper input of the NOR gate 4). Additionally, the outH signal may be active if the complementary (Q with a vertical bar over it) output of flip-flop 3 is active, even if the UP signal is inactive. Flip-flop 3 is an edge-triggered D-type flip-flop in this embodiment. The complementary output of flip-flop 3 may become active following a reset of DLL circuit 10, which includes the asserting of the reset signal shown in the drawing. The assertion of the reset signal clears the flip-flop 3, and thus the complementary output of the flip-flop 3 is activated (binary 1). The complementary output of flip-flop 3 is the lower input to the NOR gate 4 and thus, if the complementary output of flip-flop 3 is active, the outH signal may be active. In this fashion, the counter 14 may count up, regardless of the phase relationship detected by phase detector 12. During this time, the UP signal may become active. On the first transition from an active to an inactive state on the UP signal, flip-flop 3 receives a rising edge on its clock input (through the inverter 6) and thus captures the D input, $V_{dd}$ (a logic 1 in this embodiment). Thus, the complementary output becomes a logical zero, or inactive. The complementary output of flip-flop 3 may remain inactive until the next assertion of the reset signal. Thus, following the initial state of counter control circuit 20, where the outH signal is asserted regardless of the state of the signal inputs from phase detector 1, subsequent states of the outH and outL signals may be determined based on the UP and LOCK signals. It should be noted that, if the LOCK signal is asserted, both the outH and outL signals may be inactive, since the logic of phase detector 12 prevents the UP and LOCK signals from being active at the same time.

Alternate embodiments of counter control circuit 20 are possible and contemplated. The specific embodiment chosen for counter control circuit 20 may be based on the output signals generated by phase detector 12. For example, if phase detector 12 generates UP and DOWN signals, the circuit of FIG. 3 may be reconfigured for such an embodiment by removing one of the inverters on the upper input to NOR gate 5 (and coupling the DOWN signal output from the phase detector 12 in place of the LOCK signal). In another alternative embodiment, the phase detector 12 may be configured to generate DOWN and LOCK signal. In such an embodiment, the circuit of FIG. 3 may be reconfigured by removing one of the inverters on the upper input to NOR gate 5 (and coupling the DOWN signal output from the phase detector 12 in place of the LOCK signal), and by coupling the NAND of the DOWN signal and the LOCK signal in place of the UP signal in FIG. 3.

In the embodiment of FIG. 3, the inverters between the LOCK signal and the NOR gate 5 and between the reset signal and the clear input of the flip-flop 3 are provided for buffering purposes. Other embodiments may provide alternative buffering or no buffering, as desired.

Figure 4:
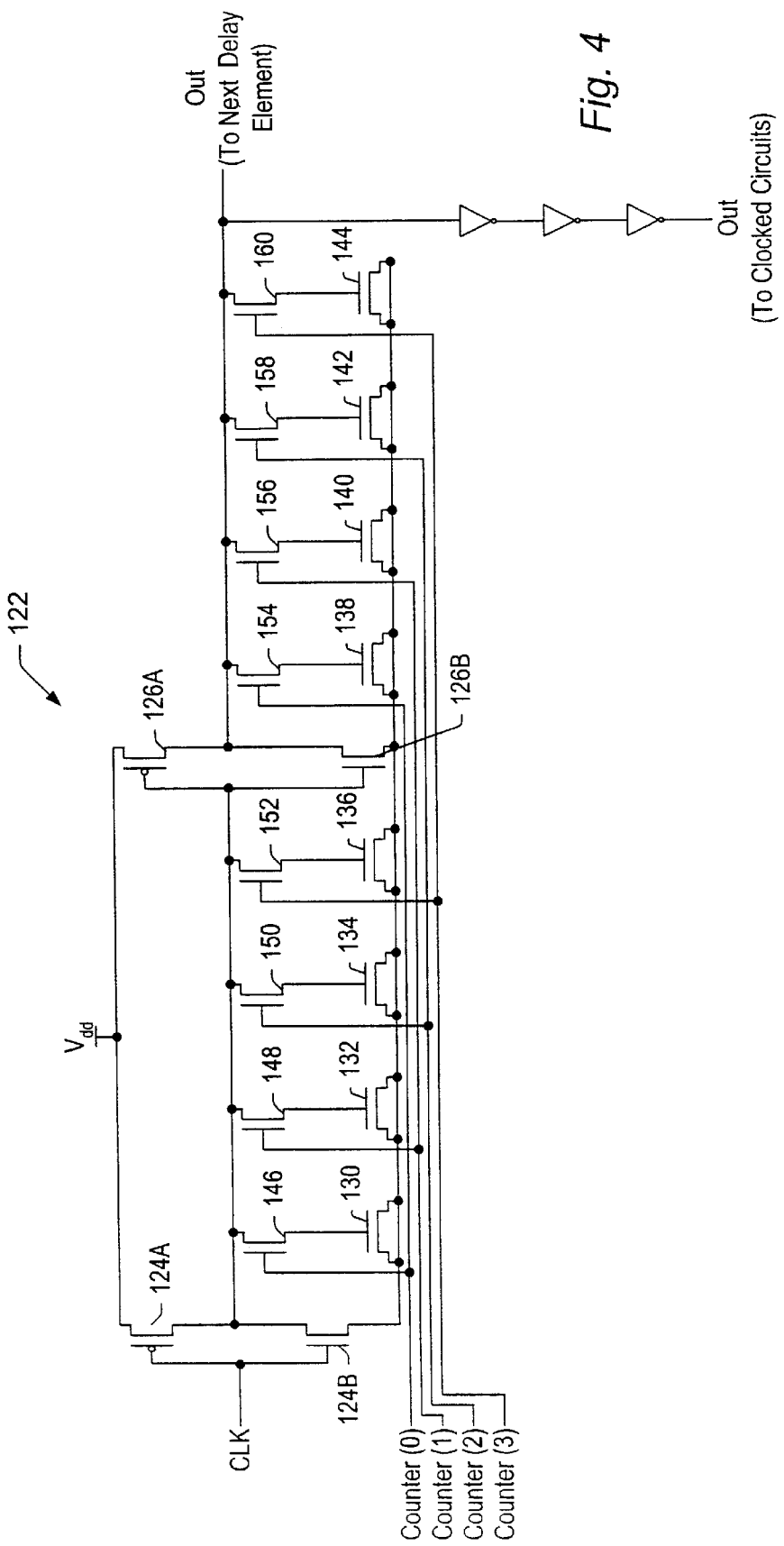
FIG. 4 is a schematic diagram of one embodiment of a delay element.

Moving now to FIG. 4, a schematic diagram of one embodiment of a delay element is shown. Delay element 122 is a programmable delay element, and may be used in programmable delay line 16 of FIG. 1, as well as being used as one of the delay elements 122A–122F in phase detector 12. Delay element 122 includes a plurality of capacitive delay elements. In the embodiment shown, field effect transistors (FETs) are used for the capacitive elements. Alternate embodiments employing capacitive elements other than FETs are possible and contemplated.

Delay element 122 is configured to receive a clock signal, such as the reference clock signal. The clock signal is input to the gate of a pair of transistors 124A and 124B forming an inverter. The inverter is loaded by one or more of the capacitive elements (transistors 130–136, through transistors 146–152, respectively) depending on the counter value. The output of the inverter formed by transistors 124A and 124B is coupled to the input of an inverter formed by transistors 126A and 126B, which is also loaded by capacitive elements (transistors 138–144 through transistors 154–160, respectively) depending on the counter value.

Delay element 122 is a programmable delay element, wherein the amount of capacitance (and thus the delay) provided is binary weighted. In other words, the amount of capacitance provided by each capacitive element may be related to the amount of capacitance of other elements by a binary factor (2, 4, 8, 16, etc.) For example, transistor 132 may have twice the capacitive load as transistor 130, transistor 134 may have 4 times the capacitive load as transistor 130, and transistor 136 may have 8 times the capacitive load as transistor 130. A similar relationship may hold for transistors 138–144. The amount of delay provided may be controlled by binary inputs to the circuit. The inputs illustrated in the drawing each bring a pair of capacitive elements into the circuit when an active high signal is present on the respective signal lines (by activating the transistors 146–160 which have gate terminals coupled to those signal lines, as shown in FIG. 4). The inputs to the circuit may be received from counter 14 (e.g. Counter(0), the least significant bit of the counter, through Counter(3) in the illustrated embodiment). Thus, (if C is the capacitive load of transistor 130 and of transistor 138), when the binary value of counter 14 output is 0001, a capacitive load of C is added to the outputs of the invertors formed from transistors 124A–124B and 126A–126B. When the binary value of to counter 14 output is 0010, the capacitive load is 2C, when the binary value is 0011, the capacitive load is 3C, and so on.

In other implementations, such as with the delay elements 122 of phase detector 12, various ones of the binary signal inputs may be hardwired to power or ground, thereby presetting the amount of delay provided to a predetermined value. It should also be noted that delay lines, either programmable or hardwired, may be formed by coupling multiple instances of delay element 122 together.

Figure 5:
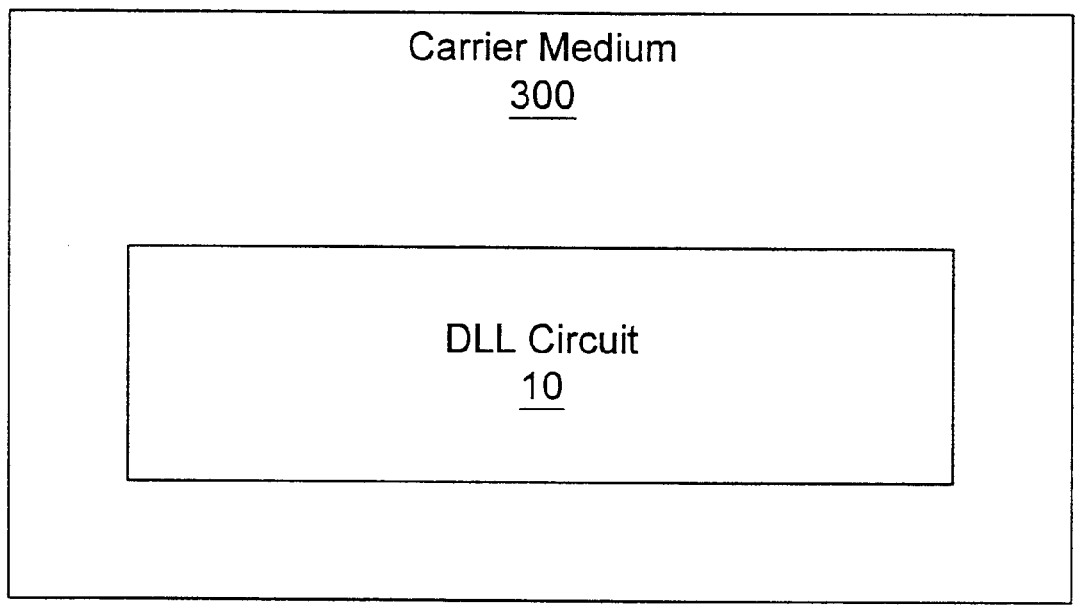
FIG. 5 is a block diagram of one embodiment of a carrier medium.

Turning next to FIG. 5, a block diagram of a carrier medium 300 including a database representative of DLL circuit 10 is shown. Generally speaking, a carrier medium may include storage media such as magnetic or optical media, e.g., disk or CD-ROM, volatile or non-volatile memory media such as RAM (e.g. SDRAM, RDRAM, SRAM, etc.), ROM, etc., as well as transmission media or signals such as electrical, electromagnetic, or digital signals, conveyed via a communication medium such as a network and/or a wireless link.

Generally, the database of DLL circuit 10 carried on carrier medium 300 may be a database which can be read by a program and used, directly or indirectly, to fabricate the hardware comprising DLL circuit 10. For example, the database may be a behavioral-level description or resister-transfer level (RTL) description of the hardware functionality in a high level design language (HDL) such as Verilog or VHDL. The description may be read by a synthesis tool which may synthesize the description to produce a netlist comprising a list of gates from a synthesis library. The netlist comprises a set of gates which also represent the functionality of the hardware comprising DLL circuit 10. The netlist may then be placed and routed to produce a data set describing geometric shapes to be applied to masks. The masks may then be used in various semiconductor fabrication steps to produce a semiconductor circuit or circuits corresponding to DLL circuit 10. Alternatively, the database on carrier medium 300 may be the netlist (with or without the synthesis library) or the data set, as desired.

While carrier medium 300 carries a representation of DLL circuit 10, other embodiments may carry a representation of any portion of DLL circuit 10, as desired.

While the present invention has been described with reference to particular embodiments, it will be understood that the embodiments are illustrative and that the invention scope is not so limited. Any variations, modifications, additions, and improvements to the embodiments described are possible. These variations, modifications, additions, and improvements may fall within the scope of the inventions as detailed within the following claims.

What is claimed is:

1. A delay locked loop (DLL) circuit comprising:

a delay line configured to delay the transitions of a reference clock signal;

a counter coupled to the delay line, wherein the counter is coupled to provide a count to the delay line, wherein the amount of delay provided by the delay line is determined by the count;

a phase detector coupled to the delay line and a counter control circuit, wherein the phase detector is configured to receive an output clock signal from the delay line and the reference clock signal, and wherein the phase detector is configured to produce one or more output signals dependent upon the phase relationship between the reference clock signal and the output clock signal; and the counter control circuit coupled to receive the one or more output signals from the phase detector, wherein the counter control circuit comprises a flip-flop, and wherein the counter control circuit is configured, responsive to a reset of the DLL circuit, to establish a first state in the flip-flop in which the counter control circuit is configured to control operation of the counter independent of the one or more output signals of the phase detector, and wherein the flip-flop is clocked by a signal derived from at least one of the one or more output signals of the phase detector, the flip-flop changing to a second state responsive to the signal, and wherein the counter control circuit is configured, responsive to the second state, to terminate the control that is independent of the one or more output signals from the phase detector.

2. The DLL circuit as recited in claim 1 wherein the predetermined control comprises causing the counter to increment, even in an event that the one or more output signals do not indicate increment.

3. The DLL circuit as recited in claim as recited in claim 2, wherein the predetermined state of the one or more output signals includes one or more output signals transitioning from indicating increment to indicating decrement.

4. The DLL circuit as recited in claim 2, wherein the counter control circuit is further configured to generate a first signal that causes the counter to increment and a second signal which causes the counter to decrement, and wherein the first signal is activated responsive to said reset and remains active until detection of the predetermined state.

5. The DLL circuit as recited in claim 1, wherein the DLL circuit is configured to lock at N=1, wherein N is an integer multiple of the period of the reference clock signal.

6. The DLL circuit as recited in claim 1, wherein the phase detector and the delay line each include one or more delay elements.

7. The DLL circuit as recited in claim 1, wherein the counter control circuit is configured to receive a reset signal indicative of the reset.

8. The DLL circuit as recited in claim 7, wherein the counter is configured to receive the reset signal and further configured to reset to zero responsive to receiving the reset signal.

9. The DLL circuit as recited in claim 8, wherein the counter control circuit is configured to cause the counter to increment responsive to activation of the reset signal.

10. The DLL circuit as recited in claim 1, wherein the one or more output signals produced by the phase detector include an UP signal and LOCK signal, wherein the UP signal, wherein active, indicated that the counter is to increment, and wherein the LOCK signal, when active indicates that the DLL circuit has achieved a phase lock.

11. A method of operating a delay locked loop (DLL) circuit, the method comprising:

generating one or more output signals from a phase detector, the one or more output signals indicative of a phase relationship between a reference clock signal and an output clock signal;

establishing a first state in a flip-flop responsive to a reset of the DLL circuit;

controlling a counter independent of the one or more output signals from the phase detector in response to the first state; and clocking the flip-flop with a signal derived from at least one of the one or more output signals of the phase detector, the flip-flop changing to a second state responsive to the signal, and wherein the counter control circuit is configured to terminate said controlling the counter responsive to detecting said second state.

12. The method as recited in claim 11, wherein said controlling comprises causing the counter to increment, even in an event that the one or more output signals do not indicate increment.

13. The method as recited in claim 12, wherein said detecting comprises detecting a transition of the one or more output signals from indicating increment to indicating decrement.

14. The method as recited in claim 13, wherein said controlling comprises generating a first signal that causes the counter to increment and a second signal which causes the counter to decrement, and wherein the first signal is activated responsive to the reset and remains active until the transition.

15. The method as recited in claim 11 further comprising initializing the counter to zero responsive to the reset.

16. The method as recited in claim 11, wherein the one or more output signals produced by the phase detector include an UP signal and a LOCK signal, wherein the UP signal, when active, indicates that the counter is to increment, and wherein the LOCK signal, when active, indicates that the DLL circuit has achieved a phase lock.

17. A carrier medium comprising one or more databases representing:

a delay line configured to delay the transitions of a reference clock signal;

a counter coupled to the delay line, wherein the counter is coupled to provide a count to the delay line, wherein the amount of delay provided by the delay line is determined by the count;

a phase detector coupled to the delay line and a counter control circuit, wherein the phase detector is configured to receive an output clock signal from the delay line and the reference clock signal, and wherein the phase detector is configured to produce one or more output signals dependent upon the phase relationship between the reference clock signal and the output clock signal; and the counter control circuit coupled to receive the one or more output signals from the phase detector, wherein the counter control circuit comprises a flip-flop, and wherein the counter control circuit is configured, responsive to a reset of the DLL circuit, to establish a first state in the flip-flop in which the counter control circuit is configured to control operation of the counter independent of the one or more output signals of the phase detector, and wherein the flip-flop is clocked by a signal derived from at least one of the one or more output signals of the phase detector, the flip-flop changing to a second state responsive to the signal, and wherein the counter control circuit is configured, responsive to the second state, to terminate the control that is independent of the one or more output signals from the phase detector.

18. The carrier medium as recited in claim 17, wherein causing the counter to count in a predetermined direction comprises causing the counter to increment, even in an event that the one or more output signals do not indicate increment.

19. The carrier medium as recited in claim 18, wherein the predetermined state of the one or more output signals includes the one or more output signals transitioning from indicating increment to indicating decrement.

20. The carrier medium as recited in claim 19, wherein the counter control circuit is further configured to generate a first signal that causes the counter to increment and a second signal which causes the counter to decrement, and wherein the first signal is activated responsive to said reset and remains active until detection of the predetermined state.

* * * * *